(12) United States Patent
Loefflad

(10) Patent No.: US 10,923,920 B2
(45) Date of Patent: Feb. 16, 2021

(54) SOLID STATE POWER CONTROLLER

(71) Applicant: HS Elektronik Systeme GmbH, Noerdlingen (DE)

(72) Inventor: Bernd Loefflad, Noerdlingen (DE)

(73) Assignee: HS ELEKTRONIK SYSTEM GMBH, Nordlingen (DE)

( * ) Notice: Subject to any disclaimer, the term of this patent is extended or adjusted under 35 U.S.C. 154(b) by 136 days.

(21) Appl. No.: 15/950,204

(22) Filed: Apr. 11, 2018

(65) Prior Publication Data

US 2018/0294652 A1   Oct. 11, 2018

(30) Foreign Application Priority Data

Apr. 11, 2017 (EP) ..................................... 17165981

(51) Int. Cl.
*H02J 4/00* (2006.01)
*H03K 17/687* (2006.01)
(Continued)

(52) U.S. Cl.
CPC ................ *H02J 4/00* (2013.01); *B64D 47/00* (2013.01); *G01R 1/30* (2013.01); *G01R 19/0007* (2013.01); *H03K 17/122* (2013.01); *H03K 17/133* (2013.01); *H03K 17/6871* (2013.01); *B64D 2221/00* (2013.01); *G01R 31/2621* (2013.01); *H03K 2217/0027* (2013.01)

(58) Field of Classification Search
CPC ............... H03K 17/122; H03K 17/133; H03K 2217/0027; H03K 17/6871; H02J 4/00; G01R 1/30; G01R 31/2621; G01R 19/0007; B64D 47/00; B64D 2221/00
See application file for complete search history.

(56) References Cited

U.S. PATENT DOCUMENTS 8,704,574 B2   4/2014 Prabhuk et al.
9,054,649 B2 *  6/2015 Wilson .................... H03F 3/195
(Continued)

FOREIGN PATENT DOCUMENTS

CN    106130522 A    11/2016
EP     2784890 A1    10/2014
(Continued)

OTHER PUBLICATIONS

Extended European Search Report for International Application No. 17165981.6 dated Oct. 4, 2017, 8 pages.

*Primary Examiner* — Carlos Amaya
*Assistant Examiner* — Esayas G Yeshaw
(74) *Attorney, Agent, or Firm* — Cantor Colburn LLP

(57) ABSTRACT

A solid state power controller configured to supply electric power from a power supply to at least one load, comprises: a solid state switching device having a first terminal (D) connected to the power supply, and a second terminal (S) connected to the load, the solid state switching device configured to switch between an OFF operation mode in which the second terminal (S) is electrically disconnected from the power supply, and an ON operation mode in which the second terminal (S) is electrically connected to the power supply, and a load current detection unit configured to detect a load current through the solid state switching device; wherein the load current detection unit comprises a first load current amplifier and a second load current amplifier.

15 Claims, 1 Drawing Sheet

(51) Int. Cl.
*B64D 47/00* (2006.01)
*G01R 19/00* (2006.01)
*G01R 1/30* (2006.01)
*H03K 17/12* (2006.01)
*H03K 17/13* (2006.01)
*G01R 31/26* (2020.01)

(56) References Cited

U.S. PATENT DOCUMENTS

| | | | |
|---|---|---|---|
| 9,078,577 B2* | 7/2015 | He | A61B 5/7203 |
| 9,276,530 B1* | 3/2016 | Liu | H03F 3/211 |
| 9,496,852 B2* | 11/2016 | Nene | H02M 3/158 |
| 2007/0035335 A1 | 2/2007 | Lee | |
| 2011/0026285 A1* | 2/2011 | Kawashima | H02M 1/4208 |
| | | | 363/127 |
| 2015/0137820 A1* | 5/2015 | Mikuteit | G01R 31/3644 |
| | | | 324/426 |
| 2018/0184490 A1* | 6/2018 | Ido | H05B 45/50 |

FOREIGN PATENT DOCUMENTS

| | | |
|---|---|---|
| EP | 3046257 A2 | 7/2016 |
| JP | 2010178608 A | 8/2010 |

\* cited by examiner

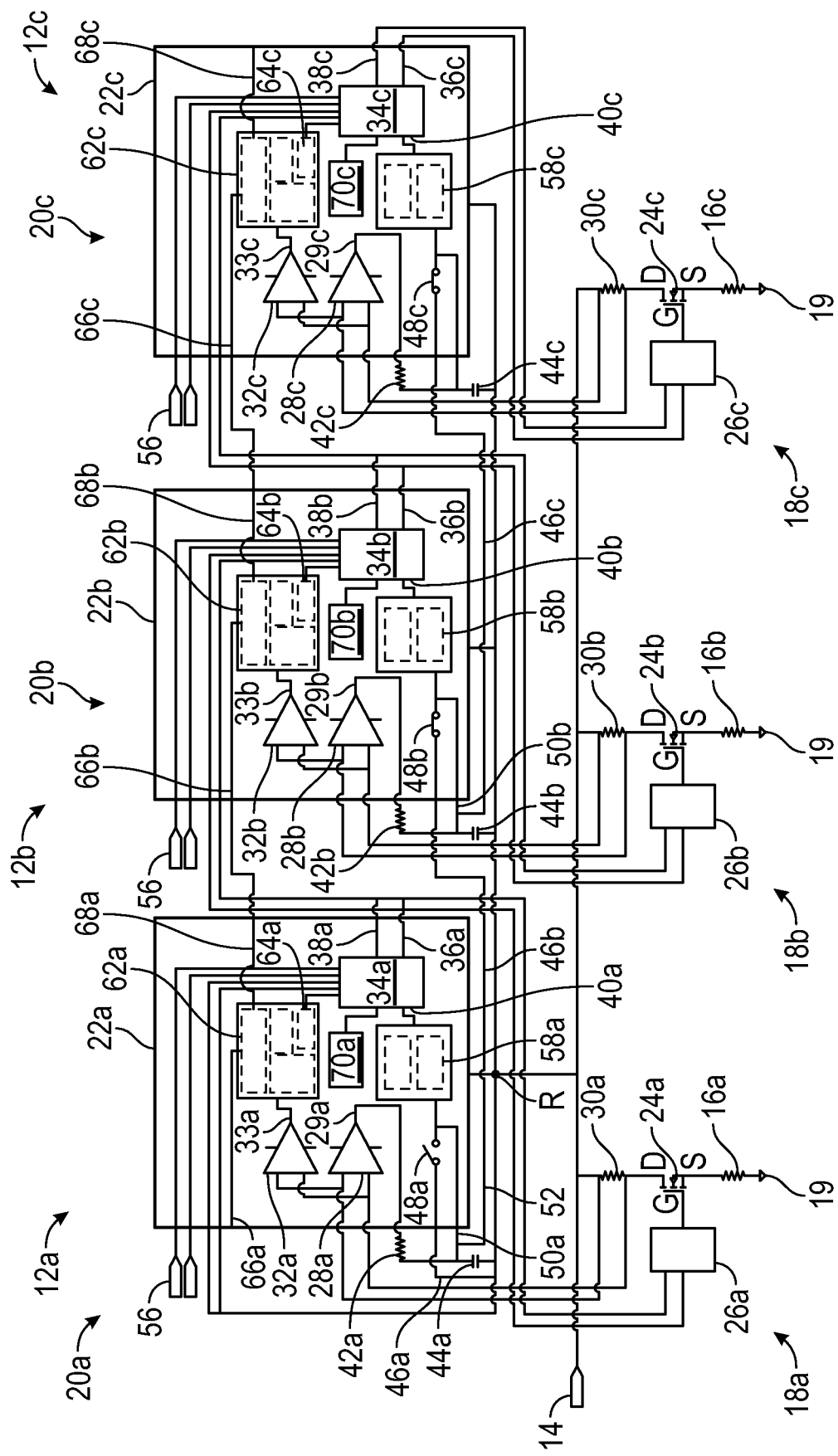

SOLID STATE POWER CONTROLLER

FOREIGN PRIORITY

This application claims priority European Patent Application No. 17165981.6 filed Apr. 11, 2017, the entire contents of which is incorporated herein by reference.

DESCRIPTION

The present invention relates to a solid state power controller (in the following referred to as SSPC) and to a power distribution system using solid state power controllers.

Vehicles, such as aircraft, typically utilize one or more power distribution systems to distribute power from a primary power source to various vehicle systems. An SSPC typically includes at least one electronic switch, such as a field effect transistor (FET), and electronic circuitry. The electronic switch is usually built in semiconductor technology and therefore referred to as a solid state switching device ("SSSD"). SSPC's have found widespread use because of their desirable status capability, reliability, and packaging density. SSPCs are gaining acceptance as a modern alternative to the combination of conventional electromechanical relays and circuit breakers for commercial aircraft power distribution due to their high reliability, "soft" switching characteristics, fast response time, and ability to facilitate advanced load management and other aircraft functions.

In aerospace, electrical power distribution SSPCs are used to switch the voltage from the power sources (e.g. generators or batteries) to the loads. Historically, these SSPCs are designed for a given current rating (e.g. 3 A, 5 A, 10 A . . . ). While SSPCs with current rating under 15 A have been widely utilized in aircraft secondary distribution systems, power dissipation, voltage drop, and leakage current associated with SSSDs pose challenges for using SSPCs in high voltage applications of aircraft primary distribution systems with higher current ratings.

An approach to provide more flexibility is to allow the paralleling of SSPCs, where the electronic switches contacts are configured such that the SSPCs share the load current. So the SSPCs can be used stand-alone or in parallel dependent on load requirements. This allows achieving larger current ratings using a plurality of SSPCs having a lower current rating connected in parallel. A typical power distribution unit may include hundreds or thousands of SSPCs.

A typical SSPC generally comprises a power section including at least one SSSD which performs the primary power ON/OFF switching, and at least one control section, which is responsible for SSSD ON/OFF control, and feeder wire protection. For producing SSSD ON/OFF control commands, the control section uses a load current signal input from a load current measurement resistor connected in the load path.

While connecting a number or SSPCs in parallel is a good conceptual approach for flexibility, due to a number of technical reasons implementation has turned to be rather difficult. One problem is that the current sharing between the SSPCs connected in parallel is not perfect. Particularly, each SSPC has a slightly different switch resistance, because of manufacturing tolerances. This results in significant challenges, e.g. when the paralleled SSPCs have to switch off as fast as possible in the event of a short circuit, or when the paralleled SSPCs are switched on in case of a load requiring high inrush current. It is important to switch the SSSDs in each SSPC simultaneously and to avoid tripping of single SSSDs under such circumstances. The load current signal input to the control section is of particular importance, as some control functions require a load current input signal having a high temporal resolution, and thus having a high bandwidth. However, other control functions exist where the control section is required to make use of a highly accurate signal. It is difficult to meet both requirements for the load current signal at the same time.

It is desirable to have a power distribution system which allows overcoming the above problems.

SUMMARY

Accordingly, embodiments as described herein include: A solid state power controller configured to supply electric power from a power supply to at least one load. The solid state power controller comprises a solid state switching device having a first terminal connected to the power supply, and a second terminal connected to the load. The solid state switching device is configured to switch between an OFF operation mode in which the second terminal is electrically disconnected from the power supply, and an ON operation mode in which the second terminal is electrically connected to the power supply. The solid state power controller comprises a load current detection unit configured to detect a load current through the solid state switching device. The load current detection unit comprises a first load current amplifier and a second load current amplifier, the first load current amplifier providing a first load current output signal having a first bandwidth, and the second load current amplifier providing a second load current output signal having a second bandwidth. In particular embodiments, the solid state power controller may be built using an application-specific integrated circuit (ASIC) comprising the first and second load current amplifiers.

Further embodiments as described herein include a power distribution system comprising a plurality of such solid state power controllers connected in parallel.

In particular, the power distribution system may be configured for managing and distributing electric power in an aircraft. Embodiments also provide an aircraft comprising the power distribution system.

BRIEF DESCRIPTION OF DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawing in which:

FIG. 1 is a simplified circuit diagram of an SSPC application in a power distribution system using paralleled SSPCs, according to an embodiment of the present invention.

DETAILED DESCRIPTION

FIG. 1 shows a schematic of an SSPC application in a power distribution system 10 using three SSPCs 12a, 12b, 12c connected in parallel. It is to be understood that the number of SSPCs connected parallel is not limited to three, but may be any number as desired to achieve a desired current rating. The electrical power distribution system 10 distributes power (DC power or AC power) from an electrical power supply (schematically indicated as a power supply bus 14) to a load. In FIG. 1 three loads 16a, 16b, 16c are indicated schematically. It is to be understood that the loads 16a, 16b, 16c may be one load common to each of the paralleled SSPCs. Moreover, although the loads 16a, 16b, 16c are indicated to be resistive loads, the loads 16a, 16b, 16c may have any characteristics, like resistive, capacitive, and/or inductive characteristics. Each SSPC 12a, 12b, 12c includes a power section 18a, 18b, 18c, and a sense and control section 20a, 20b, 20c. The power section 18a, 18b, 18c comprises a solid state switching device SSSD 24a, 24b, 24c and provides for actually switching between an ON operation mode in which the supply voltage provided by power supply 14 is electrically connected to the respective load 16a, 16b, 16c, and an OFF operation mode in which the supply voltage provided by power supply 14 is disconnected from the respective load 16a, 16b, 16c. Each sense and control section section 20a, 20b, 20c comprises a respective application-specific integrated circuit (ASIC) 22a, 22b, 22c including circuitry for controlling ON/OFF operation modes of the respective SSSD 24a, 24b, 24c, as described in more detail below. The ASIC 22a, 22b, 22c is a mixed signal ASIC combining an analog signal processing portion and a digital signal processing portion on one and the same ASIC. FIG. 1 schematically shows the power sections 18a, 18b, 18c and the sense and control sections 20a, 20b, 20c including respective ASICS 22a, 22b, 22c of the SSPCs 12a, 12b, 12c, as far as relevant to the present invention. Other parts of the SSPCs 12a, 12b, 12c are not shown for sake of clarity.

The SSSD 24a, 24b, 24c may be based on any known semiconductor technology used for production of power switching devices. In one example, SSSDs 24a, 24b, 24c may have the configuration of field effect transistors. A particular embodiment of a field effect transistor is a Si-MOSFET (metal oxide semiconductor field effect transistor). The Si-MOSFET transistor may be made in NMOS technology. Other configurations are conceivable for the SSSD switching devices 24a, 24b, 24c as well, particularly any other kind of switching devices or transistors based on Si technology. Moreover, the SSSDs 24a 24b, 24c may be any kind of bipolar transistor (e.g. a JFET) or unipolar transistor (e.g. a FET or an IGBT). The paralleled power distribution design suggested herein may be beneficial for power distribution systems based on other types of SSSD's as well, particularly for SiC based switching devices or transistors like SiC-MOSFET's or SiC-IGBT's. SiC FET's have turned out to be particularly sensitive with respect to thermal loads induced by temperatures increasing above a nominal temperature.

Each of the SSSDs 24a, 24b, 24c includes a first terminal (in the MOSFETs of FIG. 1: drain D), a second terminal (in the MOSFETs of FIG. 1: source S), and a control terminal (in the MOSFETs of FIG. 1: gate G). Depending on a control voltage applied to control terminal (gate G), an electrical path between the first terminal (drain D) and the second terminal (source S)—in the following referred to as "source-drain path"—will be open (ON condition), or closed (OFF condition). When the source-drain path of the SSSD 24a, 24b, 24c is in the ON condition, usually the source-drain path will be fully open (e.g. the electrical resistance of the source-drain path will be at a minimum), and the SSSD 24a, 24b, 24c operates in the ON operation mode. When the source-drain path of the SSSD 24a, 24b, 24c is in the OFF condition, the source-drain path will be closed (e.g. the electrical resistance of the source-drain path will be very large, or even infinity) and the SSSD 24a, 24b, 24cv operates in the OFF operation mode. The first terminal (drain D) of the SSSD 24a, 24b, 24c is connected to line input as provided by power supply 14, and therefore has the electric potential of the power supply. The power supply may be any kind of DC power supply or AC power supply. A 28V DC power supply is exemplary shown in FIG. 1. It is to be understood that power supply 14 may be any other kind of DC power supply (e.g. 270 V DC) or any kind of an AC power supply, e.g. a 115V/400 Hz AC power supply. The second terminal (source S) of the SSSD 24a, 24b, 24c is connected to load 16a, 16b, 16c.

The control terminal (gate G) of each SSSD 24a, 24b, 24c is connected to a respective gate drive 26a, 26b, 26c of the SSPC 12a, 12b, 12c. The gate drive 26a, 26b, 26c is configured to control an electrical potential of the gate G of the respective SSSD 24a, 24b, 24c. Depending on the electric potential of gate G, the source-drain path of SSSD 24a, 24b, 24c will be conductive, thereby electrically connecting the first terminal (drain D) with the second terminal (source S) of SSSD 24a, 24b, 24c ("ON" operation mode of the SSSD), or non-conductive, thereby isolating the first terminal (drain D) from the second terminal (source S) of SSSD 24a, 24b, 24c ("OFF" operation mode of the SSSD). In the OFF operation mode of the SSSD 24a, 24b, 24c, the second terminal (source S) will be at ground potential (as indicated by 29 in FIG. 1). SSSD 24a, 24b, 24c is configured to switch between ON operation mode and OFF operation mode based on commands supplied to the gate drives 26a, 26b, 26c by the sense and control section 20a, 20b, 20c of the SSPC 12a, 12b, 12c as described in further detail below.

Depending on the electric potential of the gate G, SSSD 24a, 24b, 24c may operate in a transient condition in which the source-drain path of the SSSD 24a, 24b, 24c will be conductive, but have an electrical resistance larger than the minimum possible electrical resistance of the source-drain path in a condition where the electrical potential of the gate G is sufficient to set SSSD 24a, 24b, 24c in the ON operation mode. Such transient condition of SSSD 24a, 24b, 24c is used in the OFF operation mode of the SSSD to dissipate a transient current flowing in the load 16a, 16b, 16c after the start of a switching OFF operation of the SSSD 24a, 24b, 24c, e.g. in case of an SSPC 12a, 12b, 12c connected to a load 16a having inductive characteristics.

Each of the SSPCs 12a, 12b, 12c includes a load current detecting unit providing signals indicative of the load current provided by the SSSD 24a, 24b, 24c to the respective load 16a, 16b, 16c. In the embodiment shown, each of the load current detecting units is configured to detect a voltage across a load current measurement resistor 30a, 30b, 30c connected serially in the load circuit, e.g. in between the power supply 14 and the first terminal D of the respective SSSD 24a, 24b, 24c or in between the second terminal S of the respective SSSD 24a, 24b, 24c and the respective load 16a, 16b, 16c. In the embodiment shown a voltage difference across the load current measurement resistor 30a, 30b, 30c, and thus indicative of the load current, is supplied to a first load current amplifier 28a, 28b, 28c. The same voltage difference is also supplied to a second load current amplifier 32a, 32b, 32c connected in parallel to the respective first load current amplifier 28a, 28b, 28c. The output of the first load current amplifier 28a, 28b, 28c delivers a first load current output signal 29a, 29b, 29c. The output of the second load current amplifier 32a, 32b, 32c delivers a second load current output signal 33a, 33b, 33c. Other load current detecting arrangements might be used in further embodiments.

The first load current amplifier 28a, 28b, 28c is a differential operational amplifier designed to deliver a high bandwidth load current output signal 29a, 29b, 29c. For example, the first load current output signal may have a bandwidth of at least 1 MHz, particularly of at least 2 MHz, and in some applications even at least 3 MHz. The term bandwidth as used herein refers to an operational frequency range of the differential operational amplifier from zero to the specified bandwidth, unless specified otherwise. The high bandwidth of the first load current output signal is particularly required when the first load current output signal is used to determine a common load current signal of a plurality of SSPCs 12a, 12b, 12c connected in parallel. The common load current signal is used to provide fast switching of the SSSDs into the OFF operation mode in case of rapidly increasing load current, e.g. resulting from a occurrence of a short-circuit or short term error currents. The determination of the common load current signal is described in more detail below.

Differential operational amplifiers available being able to deliver a high bandwidth output signal, as specified above, are limited with respect to the accuracy of the output signal achievable. This particularly applies with respect to available technologies to provide differential operational amplifiers designed for a mixed type ASIC. With respect to providing a common load current signal, a limited accuracy of the first load current output signal 29a, 29b, 29c is acceptable, particularly since the combination of the first load current output signal 12a from one the paralleled SSPCs 12a with the first load current output signals 12b, 12c from the other SSPCs 12b, 12c provides an averaging by itself.

With respect to other functions to be provided by the sense and control section 20a, 20b, 20c, it would be desirable to have a load current output signal with better accuracy than available from the first load current amplifier 28a, 28b, 28c. This is particularly relevant when a comparatively low value of the load current is to be measured, for example when operating a load with an AC power source via SSSD's 24a, 24b, 24c and one, or a plurality, of the SSSDs 24a, 24b, 24c has to be switched off when a zero-crossing of the load current occurs. Therefore, each of the ASICs 22a, 22b, 22c includes a second load current amplifier 32a, 32b, 32c connected in parallel to the first load current amplifier 28a, 28b, 28c. The second load current amplifier 32a, 32b, 32c is a differential operational amplifier designed to deliver a second load current output signal 33a, 33b, 33c having a lower bandwidth than the first load current output signal 29a, 29b, 29c, but having a better accuracy than the first load current output signal 29a, 29b, 29c. For example, the second load current output signal 33a, 33b, 33c may be limited to a bandwidth of 80 kHz or lower, particularly to 60 kHz or lower, and in some applications even to 40 kHz or lower. However, the accuracy of the second load current output signal 33a, 33b, 33c may be as high as at least 10% at a measured load current of 20% of the load current rating, particularly an accuracy of at least 7.5% at a measured load current of 20% of the load current rating, particularly an accuracy of at least 5% at a measured load current of 20% of the load current rating.

The ASIC 22a, 22b, 22c of the sense and control section 20a, 20b, 20c of each SSPC 12a, 12b, 12c particularly includes a gate logic and control unit 34a, 34b 34c. Each of the gate logic and control units 34a, 34b 34c is connected to the respective gate drive 26a, 26b, 26c of SSSDs 24a, 24b, 24c and configured to apply control signals 36a, 38a; 36b, 38b; 36c, 38c to the respective gate drive 26a, 26b, 26c. In FIG. 1, two of these control signals are shown, although there may be more control signals. The first control signal 36a, 36b, 36c is a gate control signal configured to control the gate voltage of SSSD 24a, 24b, 24c during normal operation such that the SSSD 24a, 24b, 24b operates in the ON operation mode or in the OFF operation mode. The second control signal 38a; 38b; 38c is a fast off control signal configured to cause an instantaneous trip off of the SSSD 24a, 24b, 24, e.g. in case of a short circuit.

The gate logic and control unit 34a, 34b, 34c includes a load control input 40a, 40b, 40c. The first load current output signal 29a, 29b, 29c is input to the logic and control unit 34a, 34b, 34c at load control input 40a, 40b, 40c via a respective load current weighting resistor 42a, 42b, 42c and a respective FAST ON/IT comparator unit 58a, 58b, 58c. Therefore, the gate logic and control unit 34a, 34b, 34c is configured to output the gate control signal 36a, 36b, 36c and the fast off control signal 38a, 38b, 38c according to the first load current output signal 29a, 29b, 29c provided by the first load current amplifier 28a, 28b, 28c of the load current detection unit.

Optionally, a capacitor, as indicated by 44a, 44b, 44b in FIG. 1, may be provided between the signal path of the first load current output signal 29a, 29b, 29c and the reference potential R of each of the sense and control sections 20a, 20b, 20c, to filter out high frequencies components which might otherwise disturb the first load current output signal 29a, 29b, 29c.

Moreover, a respective load current combination path 46a, 46b, 46c is provided in each of the sense and control sections 20b and 20c. The load current combination path 46b, 46c branches from the signal path of the first load current output signal 29a, 29b, 29c between the first load current amplifier 28a, 28b, 28c and the load current input 40a, 40b, 40c and connects the signal path of the first load current output signal 29b, 29c of a respective one of the SSPCs 12b and 12c to the signal path of the first load current output signal 29a, 29b path of another one of the SSPCs 12a and 12b. In case of the first SSPC 12a, no load current combination path is provided, but a branch 46a corresponding to the load current combination path connects the signal path of the first load current output signal 29a to reference potential R. SSPC 12a is a master SSPC in the embodiment of FIG. 1, and therefore receives the first load current output signals 29b, 29c from the other SSPCs 12b and 12c for providing a common load current signal based on all first load current output signals 29a, 29b, 29c. A load current combination switch 48a, 48b, 48c is connected serially in the load current combining path 46b and 46c, as well as in the current path 46a. In the case of the SSPC 12a (which is the master SSPC), the load current combination switch 48a is open, and therefore the current path 46a is inactive. In the cases of the SSPCs 12b and 12c (which are slave SSPCs), the load current combination switches 48b, 48c are closed. This has the consequence that the first load current output signal 29c delivered by the first load current amplifier 28c of the third SSPC 12c is delivered to the SSPC 12b and combined with the first load current output signal 29b delivered by the first load current amplifier 28b of the second SSPC 12b at a combination knot 50b. Therefore, downstream of the combination knot 50b a first common load current signal 52 derived by the combination of first load current output signals 29c and 29b is delivered to the first SSPC 12a at combination knot 50a. In the embodiment shown the first common load current signal 52 represents an average of the individual first load current output signals 29c and 29b provided by the first load current amplifiers 28b, 28c of the SSPCs 12b and 12c. In the same way, the first common load current signal 52 is delivered to the SSPC 12a and combined with the first load current output signal 29a delivered by the first load current amplifier 28a of the first SSPC 12*a* at combination knot 50*a*. Therefore, downstream of the combination knot 50*a* a common load current signal 54 derived by the combination of first load current output signal 29*a* and first common load current signal 52 is delivered and received by the logic and control unit 34*a* of first SSPC 12*a* at input terminal 40*a*. In the embodiment shown the common load current signal 54 represents an average of the individual first load current output signal 29*a* and the first common load current signal 52. The weighting resistors 42*a*, 42*b*, and 42*c* may be adjusted such that the common load current signal 54 received at input terminal 40*a* of the logic and control unit 34*a* of the first SSPC 12*a* represents a true average of the three individual first load current output signals 29*a*, 29*b*, 29*c* provided by the first load current amplifiers 28*a*, 28*b*, 28*c* of the individual SSPCs 12*a*, 12*b*, 12*c*. Thereby, the logic and control unit 34*a* provides its control signals 36*a*, 38*a* for operation of the gate drive 26*a* based on a common load current signal 54, instead of the load current signal 29*a* detected by the first load current amplifier 28*a* of the first SSPC 12*a*.

In the configuration shown in FIG. 1, the first SSPC 12*a* is configured to be a master SSPC, while the second and third SSPCs 12*b* and 12*c* are configured to be slave SSPCs. Configuration of each of SSPCs 12*a*, 12*b*, 12*c* as a master SSPC or as a slave SSPC is determined by a command received by the logic and control units 34*a*, 34*b*, 34*c* of each SSPC 12*a*, 12*b*, 12*c* from a higher order control unit of the power distribution system 10. In FIG. 1, the higher order control unit is schematically indicated at 56. As shown in FIG. 1, the logic and control unit 34*a* of master SSPC 12*a* delivers its control signals 36*a*, 38*a* not only to its gate drive 26*a*, but in addition also to the logic and control unit 34*b* of another SSPC 12*b*, in the embodiment of FIG. 1 to the logic and control unit 34*b* of its adjacent SSPC 12*b*. SSPC 12*b* is a slave SSPC. This configuration has the consequence that slave SSPC 12*b* outputs its control signal signals 36*b* and 38*b* based on the gate control signal 36*a* and fast off control signal 38*a* received from the logic and control unit 34*a* of the first SSPC 12*a*. These control signals will have priority on any control signals created internally by logic and control unit 34*b*, as consequence of its configuration being a slave SSPC. In the same way, the configuration of the third SSPC 12*c* being a slave SSPC has the consequence that slave SSPC 12*c* outputs its control signal signals 36*b* and 38*b* based on the gate control signal 36*a* and fast off control signal 38*a* received from the logic and control unit 34*b* of the second SSPC 12*b*. These control signals will have priority on any control signals created internally by logic and control unit 34*c*, as consequence of its configuration being a slave SSPC.

Thereby, it is ensured that each of the SSPCs 12*a*, 12*b*, and 12*c* operate synchronously. Moreover, operation of the each of the SSPCs 12*a*, 12*b*, 12*c* is based on a common first load current output signal being derived as a common signal from each of the first load current output signals 29*a*, 29*b*, 29*c* provided by the first load current amplifiers 28*a*, 28*b*, 28*c* associated with the individual SSPCs. Analog load current combination of paralleled SSPCs as described herein will allow to trip of each of SSPC 12*a*, 12*b*, 12*c* being connected in paralleled in coordinated way. Hence, in case of switching into a short-circuit, SSPCs 12*a*, 12*b*, 12*c* will always switch simultaneously. Moreover, this configuration will also ensure that in case of high inrush currents switching all SSPCs based on the common load current will avoid tripping of a single SSPC in the paralleled group of SSPCs 12*a*, 12*b*, 12*c*. The control signals 36*a*, 38*a*; 36*b*, 38*b*; 36*c*, 38*c* to the gate drives 26*a*, 26*b*, 26*c* are derived based on a common first load current output signal. The common first load current output signal provides a steady state current measurement which may also be useful in the a higher level process in the system. Particularly, the common load signal may provide an average load signal with respect to all SSPCs in the group of SSPCs connected in parallel. The common load signal may be reported to higher level control unit 56, e.g. by the master SSPC 12*a*. For example, in case the common load current delivered by the master SSPC 12*a* represents an average load current for each of SSPCs 12*a*, 12*b*, 12*c*, the higher level control unit 56 may calculate an overall current by multiplying the average load current by the number of paralleled SSPCs. For example, such average load current among all of the paralleled SSPCs could be used by the higher level control unit 56 to supervise the standard I2t curve of a single SSPC also for a paralleled group.

The second load current signal 33*a*, 33*b*, 33*c* is delivered from the second load current amplifier 32*a*, 32*b*, 32*c* to a further control unit 62*a*, 62*b*, 62*c* provided on the ASIC 22*a*, 22*b*, 22*c*. The further control unit 62*a*, 62*b*, 62*c* provides for a further amplification of the second load current signal 33*a*, 33*b*, 33*c*, and conversion of the second load current signal 33*a*, 33*b*, 33*c* into a digital second load current signal. The digital second load current signal is used in a current zero-crossing calculation unit 64*a*, 64*b*, 64*c* included of the further control unit 62*a*, 62*b*, 62*c* for calculating a current zero-crossing value which is delivered to the gate logic and control unit 34*a*, 34*b*, 34*c*. Where a plurality of SSPCs 12*a*, 12*b*, 12*c* are connected in parallel and should be switched on and off synchronously, the current zero-crossing values calculated by the respective current zero-crossing calculation units 64*a*, 64*b*, 64*c* of individual SSPCs 12*a*, 12*b*, 12*c* are used to calculate a common current zero-crossing value which is supplied to the individual gate logic and control units 34*a*, 34*b*, 34*c*. For synchronization purposes, each of the ASICs 22*a*, 22*b*, 22*c* of the individual SSPCs 12*a*, 12*b*, 12*c* has a Sync Input 66*a*, 66*b*, 66*c* and a Sync Output 68*a*, 68*b*, 68*c*. The Sync Out 68*a* of the master SSSPc 12*a* is connected to the Sync In of the first slave SSSPc 12*b*, and the Sync Out of the first slave SSPC 12*b* is connected to the Sync In of the second slave SSPC 12*c*.

Each of the ASICs 22*a*, 22*b*, 22*c* also includes a voltage zero-crossing determination unit 70*a*, 70*b*, 70*c*. A voltage zero-crossing signal is provided to the gate logic and control unit 34*a*, 34*b*, 34*c* of each SSPC 12*a*, 12*b*, 12*c* from the respective voltage zero-crossing determination unit 70*a*, 70*b*, 70*c*.

Embodiments of a solid state power controller as described herein comprise a load current detection unit configured to detect a load current through the solid state switching device. The load current detection unit comprises a first load current amplifier and a second load current amplifier, the first load current amplifier providing a first load current output signal having a first bandwidth and the second load current amplifier providing a second load current output signal having a second bandwidth.

The solid state switching device has a first terminal connected to the power supply, and a second terminal connected to the load, the solid state switching device configured to switch between an OFF operation mode in which the second terminal is electrically disconnected from the power supply, and an ON operation mode in which the second terminal is electrically connected to the power supply. Normally, the solid state switching device also has a control terminal and is configured to switch, according to a drive voltage applied to the control terminal, between the OFF operation mode in which the second terminal is electrically disconnected from the power supply, and the ON operation mode in which the second terminal is electrically connected to the power supply. The load current detection unit is particularly configured to detect an electrical current from the first terminal to the second terminal of the solid state switching device. The electric path between the first terminal and the second terminal of the semi-conductor switching device is referred to as "source-drain path" of the SSSD throughout this disclosure. This denotation is typically used in connection with field effect transistors, however it be understood that the term "source-drain path" as used herein applies to other types of SSSDs as well (e.g. to bipolar transistors where the terms "emitter" and "collector" are commonly used instead of "source" and "drain").

The solid state switching device may comprise a field effect transistor, particularly a metal oxide semiconductor field effect transistor (MOSFET). For example, the field effect transistor may comprise a Si field effect transistor. With a field effect transistor, the first terminal will be drain, the second terminal will be source, and the control terminal will be gate. Drain may be connected to the supply voltage and source may be connected to the load circuit. A field effect transistor features easy control. Moreover, MOSFETs have a bi-directional conduction characteristic, a resistive conduction nature, and a positive temperature coefficient. To increase the current carrying capability and reduce the voltage drop or power dissipation, the SSSD may comprise multiple MOSFETs generally connected in parallel.

The field effect transistor may comprise a Si field effect transistor as a basic solid state component for building up the solid state switching device. Alternatively, the field effect transistor may comprise a SiC field effect transistor as a basic solid state component for building up the solid state switching device. SiC based SSSDs can be operated at elevated temperatures up to 175° C. Junction Temperature and for switching high line input voltages up to 1200 V.

The SSPCs may be used for switching DC loads as well as AC loads. Typical supply voltages may include 115 VAC; 230 VAC; 28 VDC (as shown in FIG. 1); or 270 VDC. Maximum currents in the load circuit to be switched may include 5 A; 10 A; 15 A; and may be as high as 45 A.

In particular embodiments the load current detection unit may comprise a current detection resistor or shunt resistor connected serially to the load. In an embodiment the current detection resistor may be connected between the power supply and the first terminal of the solid state switching device. In another embodiment the current detection resistor may be connected between the second terminal of the solid state switching device and the load. The first and second load current amplifiers each may provide an output signal characteristic of a voltage drop across the load current measurement resistor. The first output signal provided by the first load current amplifier may have a larger bandwidth than the second output signal provided by the second load current amplifier.

Particularly, the first load current amplifier and the second load current amplifier may be connected in parallel to each other. Inputs of each of the first and second load current amplifiers may be supplied by the voltages upstream and downstream of the load current measurement resistor, respectively. Thus, each of the first and second load current amplifiers amplifies a signal corresponding to the voltage difference across the load current measurement resistor and provides a respective first or second load current output signal representing the voltage difference across the load current measurement resistor. The first load current amplifier is designed to meet the high bandwidth requirement. It provides a single ended output signal which can be used to create an "analog current averaging function" using paralleled ASICs, as set out herein. Basically, the first load current amplifier is used for amplifying high level load current signals as detected by the load current measurement resistor. The second load current amplifier is designed to meet the high accuracy requirement. This requirement is particularly important in situations where the load current measurement resistor detects only low level load current signals. In order to meet the high accuracy requirement, the second load current amplifier uses only a limited bandwidth, compared to the first load current amplifier. Also the second load current output signal may be subject to an averaging procedure with respect to a plurality of second load current output signals detected by a plurality of SSPCs connected in parallel. This averaging of the second load current output signals will be performed in the next higher application level of the SSPC control.

The embodiments described herein allow to combine two different functions or characteristics for detecting load current in one and the same ASIC. The first current load amplifier provides a current sense function which has high bandwidth (e.g. approx. 1 MHZ). The second current load amplifier provides for a current sense function with has a high accuracy (e.g. at least 10% at a measured load current of 20% of the load current rating). Both functions are difficult to implement into a mixed signal ASIC design with state of the art processes. As suggested herein, the two different current sense functions are split into a high speed path (high bandwidth) and a low speed path (low bandwidth). No additional components need to be added to support the ASIC for implementing both current sense functions. It was recognized that the high speed path does not need the same high accuracy as the low speed path. Rather, it is only important that the high speed path is provided with a load current averaging function allowing to provide a common or averaged load current signal from the first load current output signals produced by a plurality of paralleled SSPCs.

Particularly, the second bandwidth may be lower than the first bandwidth. Thus, the second load current amplifier may be designed to provide a current measurement of lower temporal resolution than the first load current amplifier. Particularly, the second load output signal provided by the second load current amplifier may be a temporarily averaged load current signal. Thus, the load current output signal provided by the second load current amplifier is not required to have bandwidth as large as the bandwidth of the load current output signal provided by the fist load current amplifier.

Particularly, the second load current output signal may have a better accuracy than the first load current output signal. The second load current output signal is suitable as in input for a number of applications requiring an accurate load current signal. Most of these applications (e.g. determination of a current zero crossing) require determination of a relatively low current signal, and hence sufficient accuracy is of paramount importance. In the interest of providing sufficient accuracy, it might be acceptable for the second load current output signal to have a lower temporal resolution, and hence a lower bandwidth, than the first load current output signal.

Particularly, the second load current output signal may have an accuracy of at least 10% at a measured load current of 20% of the load current rating, particularly an accuracy of at least 7.5% at a measured load current of 20% of the load current rating, particularly an accuracy of at least 5% at a measured load current of 20% of the load current rating.

Particularly, the second load current output signal may have a bandwidth of 80 kHz or lower, particularly of 60 kHz or lower, particularly of 40 MHz or lower.

In particular embodiments, the solid state power controller further may comprise an additional amplifier stage configured to further amplify the second load current output signal. Moreover, the solid state power controller further may comprise current zero crossing unit for providing a current zero crossing signal based on the second load current output signal.

In particular embodiments, the first load current output signal may be configured to determine a common load current based on a plurality of first load output currents provided by the first load current amplifiers of at least two solid state power controllers connected in parallel. Operation of the solid state switching devices of the at least two solid state power controllers connected in parallel may be controlled based on the common load current. Thereby, simultaneous switching of all paralleled solid state power controllers can be ensured.

The common load current may be an average load current or a summation load current determined from the first load output currents provided by the first load current amplifiers of the at least two solid state power controllers connected in parallel. Thus, operation of the solid state switching devices of the at least two solid state power controller connected in parallel will be controlled according to the average load current.

Further, each of the solid state power controllers connected in parallel may comprise a weighting resistor connected in between an output of the first load current amplifier and a knot at which the output signals of the first load current amplifiers of the at least two solid state power controllers are combined to form the common load current signal Particularly, each of the solid state power controllers may comprises a load current combining switch and may be configured to communicate, in a closed state of the load current combining switch, the first load current output signal provided by the first load current amplifier to another solid state power controller.

Further, each of the solid state power controllers may be configured to communicate, at least in an open state of the load current combining switch, the first load current output signal provided by the first load current amplifier to a logic and control unit of the solid state power controller for controlling operation of the solid state power controller, particularly for controlling the switching of the solid state power controller between the ON operation mode and the OFF operation mode.

Further embodiments relate to a power distribution system comprising at least two solid state power controllers connected in parallel. In such further embodiments, the power distribution system may have a master and slave configuration. For example, one of the at least two solid state power controllers connected in parallel may be configured to be a master solid state power controller and the other solid state power controllers connected in parallel may be configured to be at least one slave solid state power controller. The master solid state power controller may be configured to communicate with the at least one slave solid state power controller for controlling operation of the at least one slave solid state power controller. Particularly, the master solid state power controller may be configured to control the switching of the at least one solid state semiconductor switch of the master power controller between the ON operation mode and the OFF operation mode based on internal logic in the master solid state power controller. Moreover, the master solid state power controller may also be configured to control the switching of the slave solid state semiconductor switch of the at least one slave solid state power controller between the ON operation mode and the OFF operation mode. Moreover, in particular embodiments, the master solid state power controller may communicate with a higher level control unit of the power distribution system with respect to reporting the status of the master solid state power controller and the slave solid state power controllers to the higher level control unit and with respect to receiving control commands for operation the solid state switching devices of the master solid state power controller and the slave solid state power controllers.

The at least one slave power controller may be configured to communicate with the master solid state power controller and/or with at least one other slave solid state power controller for communicating the first load current output signal detected by its first load current amplifier. The slave power controllers might be configured to report other status information to a higher level control unit of the power distribution system, or to the master solid state power controller and/or to the at least one other slave solid state power controller. Particularly, the slave solid state power controller may be configured to control the switching of the at least one solid state semiconductor switch of the slave power controller between the ON operation mode and the OFF operation mode, based on control commands received from the master solid state power controller.

First load current output signals output from first load current amplifiers of each of the SSPCs may be directly connected at a combination knot to provide a common load current signal downstream of the combination knot. The connecting of the load current signals may be done using analog load current combination switches provided for each of the SPCCs connected in parallel. One of the SSPCs has its load current combination switch in an open configuration, the other SSPCs have their load current combination switches in a closed. Thereby, the load currents detected by the SSPCs with load current combination switches in a closed configuration may be communicated to the SSPC having its load current combination switch in an open configuration, and may be combined to a common load current signal. In a configuration with a master SSPC and slave SSPC, the master SSPC may have its analog load current combination switch not closed, and the slave SSPCs may have their analog load combination switches closed. The first load current output signal may be averaged via respective serial weighting resistors. Thereby, the SSPC with an open configuration of the current combination switch gets an analog "averaged current" value as an averaged voltage signal. The SSPC with the open configuration of the current combination switch may control the control signal to the gate drives of all SSPCS and may report the averaged current in translating the voltage value to higher level for further processing via communication interface.

In the power distribution system as described herein the power supply may provide a DC voltage or an AC voltage.

The power distribution system may be configured for managing and distributing electric power in an aircraft. Therefore, embodiments disclosed herein may also relate to an aircraft comprising the power distribution system described herein.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A solid state power controller configured to supply electric power from a power supply to at least one load, comprising:
 a solid state switching device having a first terminal (D) connected to the power supply, and a second terminal (S) connected to the load, the solid state switching device configured to switch between an OFF operation mode in which the second terminal (S) is electrically disconnected from the power supply, and an ON operation mode in which the second terminal (S) is electrically connected to the power supply; and
 a load current detection unit configured to detect a load current through the solid state switching device,
 wherein the load current detection unit comprises a first load current amplifier and a second load current amplifier, the first load current amplifier providing a first load current output signal having a first bandwidth and the second load current amplifier providing a second load current output signal having a second bandwidth,
 wherein the solid power controller further comprises a current zero crossing unit for providing a current zero crossing signal based on the second load current output signal.

2. The solid state power controller according to claim 1, wherein the first load current amplifier and the second load current amplifier are connected in parallel to each other.

3. The solid state power controller according to claim 1, wherein the second bandwidth is lower than the first bandwidth.

4. The solid state power controller according to claim 1, wherein the second load current output signal has a bandwidth of 80 kHz or lower.

5. The solid state power controller according to claim 1, further comprising an additional amplifier stage configured to further amplify the second load current output signal.

6. The solid state power controller according to claim 1, wherein the first load current output signal is configured to determine a common load current based on a plurality of load currents detected by load current detection units of at least two solid state power controllers connected in parallel.

7. The solid state power controller according to claim 1, further comprising a load current combining switch configured to communicate, in a closed state of the load current combining switch, the first output load current to another solid state power controller.

8. The solid state power controller according to claim 7, being configured to communicate, in an open state of the load current combining switch, the first output load current signal to a sense and control unit of the solid state power controller for controlling operation of the solid state power controller.

9. The solid state power controller according to claim 1, comprising an application-specific integrated circuit comprising the first and second current amplifiers.

10. The solid state power controller according to claim 4, wherein the second load current output signal has a bandwidth of 60 kHz or lower, particularly of 40 kHz or lower.

11. The solid state power controller according to claim 1, wherein the second load current output signal has a bandwidth of 40 kHz or lower.

12. A power distribution system comprising at least two solid state power controllers according to claim 1 connected in parallel, wherein one of the at least two solid state power controllers connected in parallel is configured to be a master solid state power controller and the other(s) of the solid state power controllers connected in parallel are configured to be at least one slave solid state power controller; the master solid state power controller being configured to communicate with the at least one slave solid state power controller for controlling operation of the at least one slave solid state power controller.

13. The power distribution system according to claim 12, wherein the at least one slave power controller is configured to communicate with the master solid state power controller and/or with at least one other slave solid state power controller for communicating the first load current signal provided by its first load current amplifier to the master solid state power controller and/or to the at least one other slave solid state power controller.

14. An aircraft comprising the power distribution system according to claim 12.

15. An aircraft comprising the power distribution system according to claim 13.

* * * * *